US008760920B2

(12) United States Patent
Kim et al.

(10) Patent No.: US 8,760,920 B2
(45) Date of Patent: Jun. 24, 2014

(54) SEMICONDUCTOR MEMORY DEVICE INTEGRATING FLASH MEMORY AND RESISTIVE/MAGNETIC MEMORY

(75) Inventors: Sook Joo Kim, Gyeonggi-do (KR); Min Gyu Sung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 446 days.

(21) Appl. No.: 12/982,825

(22) Filed: Dec. 30, 2010

(65) Prior Publication Data
US 2012/0092935 A1 Apr. 19, 2012

(30) Foreign Application Priority Data

Oct. 14, 2010 (KR) .................. 10-2010-0100263

(51) Int. Cl.
*G11C 16/04* (2006.01)
(52) U.S. Cl.
USPC ............ 365/185.05; 365/185.33; 365/185.03; 365/189.2; 365/148; 365/158; 365/163; 365/173
(58) Field of Classification Search
USPC ............ 365/185.03, 185.08, 185.33, 185.29, 365/185.05, 148, 158, 163, 173, 171, 189.2
See application file for complete search history.

(56) References Cited

U.S. PATENT DOCUMENTS

| 7,480,174 B2 * | 1/2009 | Lee et al. .................... 365/163 |
| 7,492,635 B2 * | 2/2009 | Kim et al. ................ 365/185.17 |
| 7,701,746 B2 * | 4/2010 | Meeks et al. ................. 365/148 |
| 8,331,127 B2 * | 12/2012 | Chen et al. .................... 365/113 |

FOREIGN PATENT DOCUMENTS

| KR | 1020010076308 | 8/2001 |
| KR | 100624463 | 9/2006 |
| KR | 100695164 | 3/2007 |
| KR | 100809701 | 3/2008 |
| KR | 1020090009457 | 1/2009 |
| KR | 1020100068923 | 6/2010 |

* cited by examiner

*Primary Examiner* — Andrew Q Tran
(74) *Attorney, Agent, or Firm* — IP & T Group LLP

(57) ABSTRACT

A semiconductor memory device includes a first memory device formed on a semiconductor substrate, including a first storage unit, a source, and a drain, a second memory device, including a second storage unit, and a bit line, wherein the second memory device is connected in series between the bit line and the drain.

21 Claims, 8 Drawing Sheets

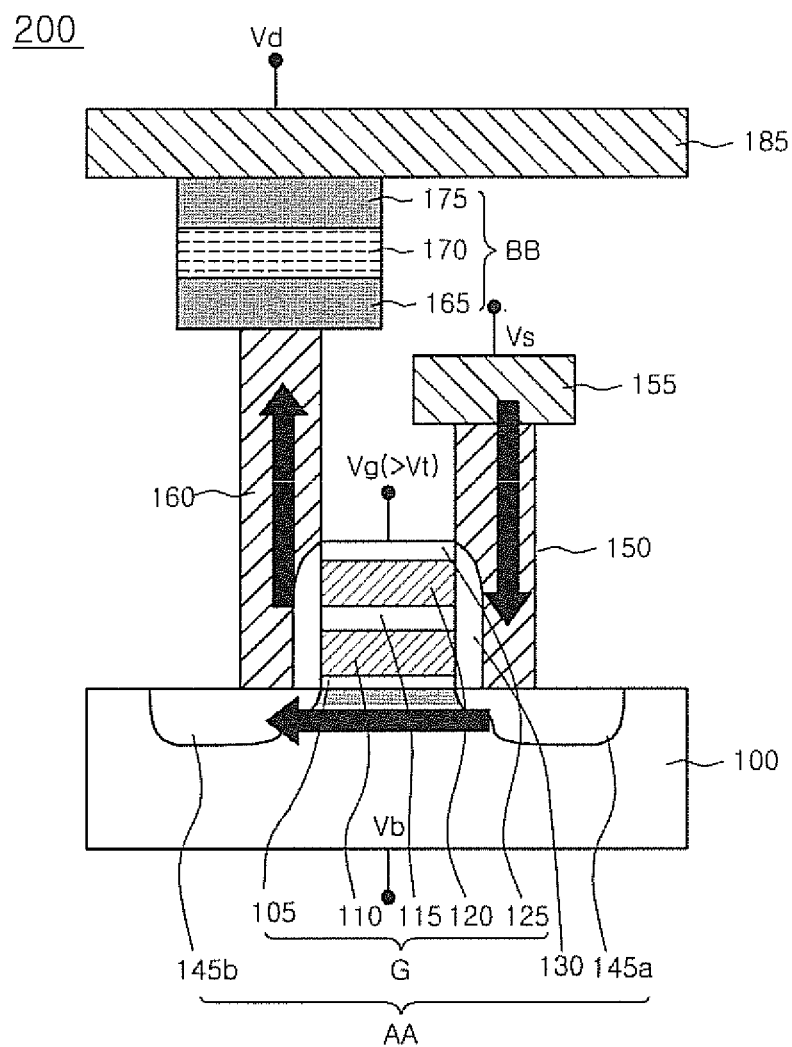

SEMICONDUCTOR MEMORY DEVICE INTEGRATING FLASH MEMORY AND RESISTIVE/MAGNETIC MEMORY

CROSS-REFERENCES TO RELATED APPLICATION

The present application claims priority under 35 U.S.C. 119(a) to Korean patent application number 10-2010-0100263, filed on Oct. 14, 2010, in the Korean Patent Office, which is incorporated by reference in its entirety.

BACKGROUND OF THE INVENTION

1. Technical Field

The inventive concept relates to a semiconductor memory device, and, more particularly, to a semiconductor memory device in which memories of different types are embedded.

2. Related Art

As the mobile and digital information communication and home appliance industries continue to develop, the demand for electron change control-based devices may reduce. Accordingly, a demand for new functional memory devices, other than the conventional electron charge devices, may increase. More specifically, development of next generation memory devices with high capacity, ultra-high speed, and low power is desired to meet the demand for high capacity memory of leading information devices.

Recently, embedded semiconductor devices in which multi-functional memory devices are integrated have been suggested. Such semiconductor devices are being developed to magnify mutual advantages of the memory devices and supplement mutual disadvantages of the memory devices.

Typically, the multi-functional semiconductor memory device is a semiconductor memory device in which a flash memory 'A' and a resistor element 'B' are combined as illustrated in FIG. 1. One flash memory and one resistor element are combined to constitute a memory cell of the semiconductor memory device.

Herein, the flash memory 'A' includes a stack gate structure formed on a semiconductor substrate 10 and a source 45a and a drain 45b formed in the semiconductor substrate 10 at both sides of the stack gate structure. The stack gate structure may be formed by stacking a tunneling insulating layer 15, a charge storage layer (or a charge trap layer) 20, a blocking layer 25, a control gate 30, and a hard mask layer 35. Insulating spacers 40 may be disposed on sidewalls of the stack gate structure.

The source 45a is electrically connected to a source interconnection 70 via a first contact plug 60 and the drain 45b is electrically connected to a bit line 75 via a second contact plug 65.

As well-known, the flash memory 'A' programs and erases charges in the charge storage layer 20 based on voltages applied to the control gate 30, the source interconnection 70, and the bit line 75.

Further, the resistor element 'B' is disposed on the stack gate structure of the flash memory 'A'. The resistor element 'B' includes a resistor material 50, having a resistance that changes based on a voltage or current provided thereto, and a switch 55, selectively providing the current to the resistor material 50. The first and second contact plugs 60 and 65 are used as electrodes providing the current to the resistor material 50.

When the switch 55 is driven, the resistor element B stores data "0" or "1" based on a voltage difference between the first and second contact plugs 60 and 65.

However, the multi-functional semiconductor memory device has disadvantages because the resistor element 'B' is formed on the flash memory 'A'.

The resistor element 'B' is disposed between the first and second contact plugs 60 and 65 and uses the first and second contact plugs 60 and 65 as electrodes. Because of this arrangement, materials that are optimal for use as electrodes for the resistor element B are not used. That is, materials used for the first and second contact plugs 60 and 65 are not optimal materials for use as electrodes for the resistor element B.

In addition, because the resistor element B is interposed between the first and second contact plugs 60 and 65, a width W1 of the resistor element B is not extended more than a line width W2 of a gate electrode (or a distance between the first and second contact plugs 60 and 65) so that there is limitation on varying a size of the resistor element B.

Moreover, the switch 55 is additionally required to drive the resistor element B and the switch 55 is also interposed in a space between the first and second contact plugs 60 and 65 so that the width W1 of the resistor element B is further reduced.

Furthermore, the reduced space makes fabricating the resistor element B and the switch 55 complicated.

SUMMARY

According to an exemplary embodiment, a semiconductor memory device includes a first memory device formed on a semiconductor substrate, including a source, a drain, and a first storage unit, a second memory device, including a second storage unit, and a bit line, wherein the second memory device is connected in series between the drain of the first memory device and the bit line.

According to another exemplary embodiment, a semiconductor memory device includes a word line, a bit line, a first memory device which stores data in a first storage unit in response to a signal of the word line, and a second memory device connected between an output terminal of the first memory device and the bit line and including a second storage unit which performs a data storage in response to a driving of the first memory device.

According to another exemplary embodiment, a semiconductor memory device includes a first memory device including a first storage unit and a second memory device electrically connected to the first memory device and including a second storage unit. Here, the semiconductor memory device is configured to drive the first memory device in response to a signal on a word line, store data in the first storage unit by providing a write voltage to the first memory device, and store data in the second storage unit according to a voltage difference between an output voltage of the first memory device and a data voltage.

These and other features, aspects, and embodiments are described below in the section entitled "DESCRIPTION OF EXEMPLARY EMBODIMENTS".

BRIEF DESCRIPTION OF THE DRAWINGS

The above and other aspects, features, and advantages of the subject matter of the present disclosure will be more clearly understood from the following detailed description taken in conjunction with the accompanying drawings, in which:

FIG. 6 is a cross-sectional view of a semiconductor memory device illustrating features of a write driving of a second memory device according to an exemplary embodiment of the inventive concept;

DESCRIPTION OF EXEMPLARY EMBODIMENTS

Figure 1:
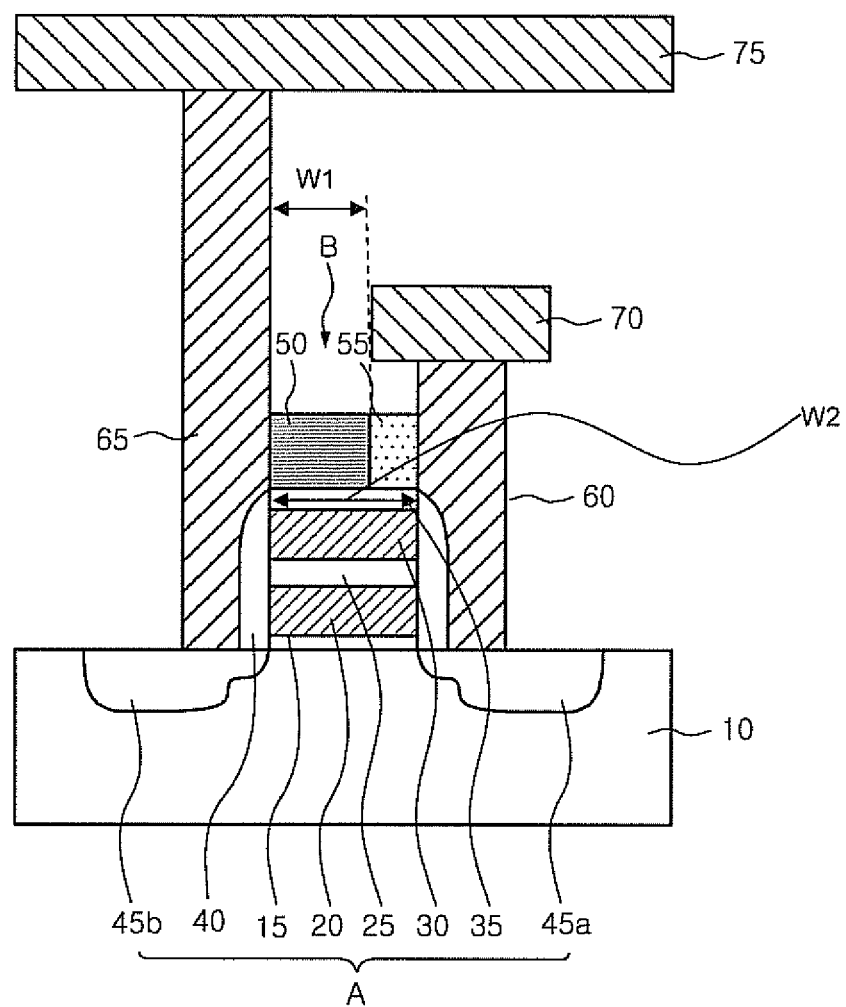
FIG. 1 is a cross-sectional view of a conventional semiconductor memory device.

Exemplary embodiments are described herein with reference to the accompanying drawings. It should be understood that variations in the shapes of the illustrations as a result, for example, of manufacturing techniques and/or tolerances, are to be expected. Thus, exemplary embodiments should not be construed as limited to the particular shapes of regions illustrated herein. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
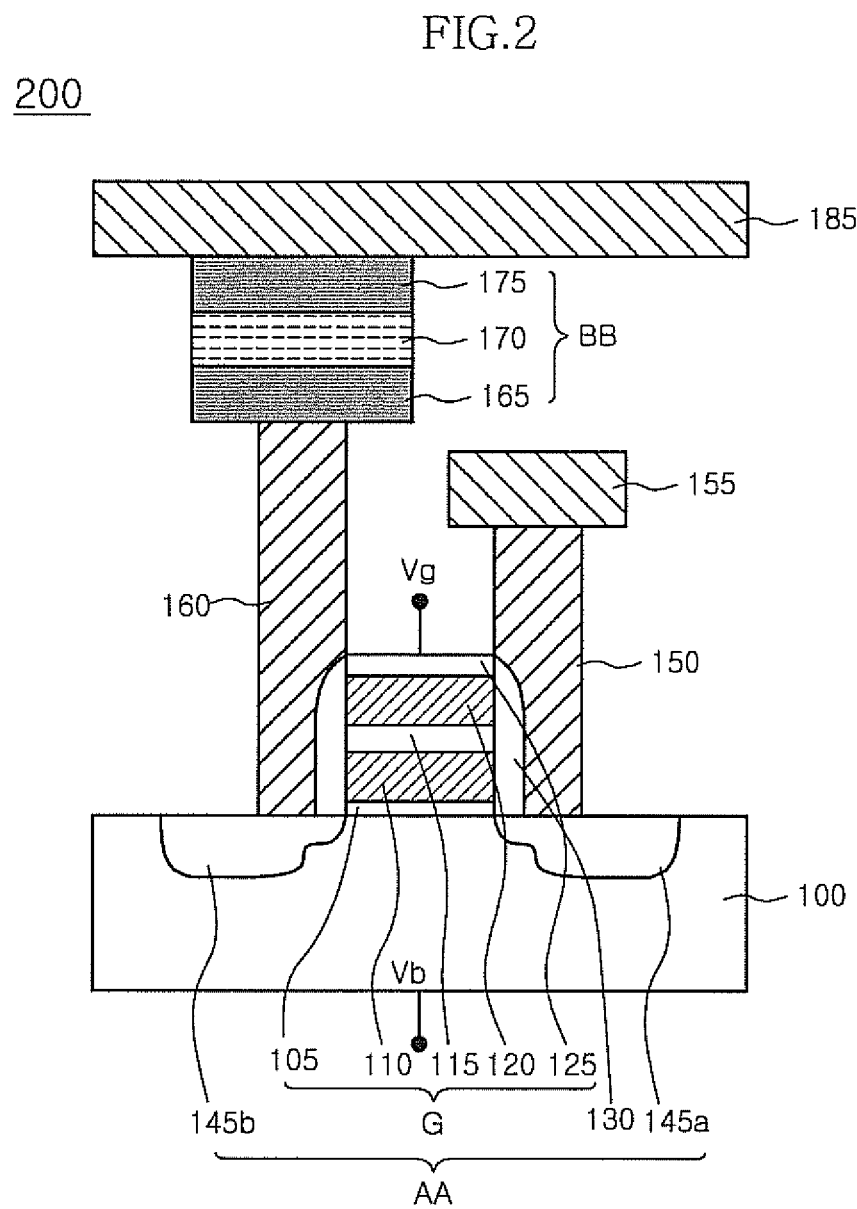
FIG. 2 is a cross-sectional view of a semiconductor memory device according to an exemplary embodiment of the inventive concept.

FIG. 2 is a cross-sectional view of a semiconductor memory device according to an exemplary embodiment of the inventive concept.

Referring to FIG. 2, a semiconductor memory device according to an exemplary embodiment includes a first memory device 'AA' including a first storage unit and a second memory device 'BB' including a second storage unit. The first and second memory devices 'AA' and 'BB' may be different types of memory devices.

The first memory device 'AA' may be a flash memory formed on a semiconductor substrate 100 and the flash memory includes a stack gate structure "G" formed on the semiconductor substrate 100 and a source 145a and a drain 145b formed in the semiconductor substrate 100 at both sides of the stack gate structure "G".

Herein, the stack gate structure "G" includes a tunneling insulating layer 105, a charge storage layer (or a charge trap layer) 110, a blocking layer 115, and a control gate 120. In addition, the stack gate structure G may further include a hard mask layer 125 for a self-aligning contact and fine patterning on the control gate 120. As well-known, the tunneling insulating layer 105 may be thinly formed, having a sufficient thickness to allow tunneling of charges between the semiconductor substrate 100 and the charge storage layer (or a charge trap layer) 110 and maintain insulation between two mediums. The charge storage layer (or the charge trap layer) 110 is formed of at least any one selected from the group consisting of a polysilicon layer, a silicon dot, and a metal dot. The charge storage layer (or the charge trap layer) 110 is not connected with any electrical signal and is a substantial storage unit of the flash memory which programs and erases charges based on a voltage of the control gate and a bulk voltage.

The source 145a and the drain 145b are formed in the semiconductor substrate 100 at opposite sides of the gate stack structure "G". The source 145 is electrically connected to a source interconnection 155 via a first contact plug 150, and a voltage (e.g., a ground voltage) is applied to the source interconnection 155. The drain 145b is electrically connected to a second contact plug 160.

The first and second contact plugs 150 and 160 may be formed of the same material or different materials. The first and second contact plugs 150 and 160 may be formed of a conductive layer having a good gap fill property, for example, a doped polysilicon layer, a tungsten metal layer, or a titanium metal layer, etc. Further, the first and second contact plugs 150 and 160 may have different heights. As shown in FIG. 2, the second contact plug 160 has a higher height than the first contact plug 150 to improve insulation between interconnections.

Insulating spacers 130 are formed on both sidewalls of the gate structure "G". The insulating spacers 130 may function to form the source 145a and the drain 145b to be lightly doped drain (LDD) types. The insulating spacers 130 may also assist in forming the first and second contact plugs 150 and 160 in a self-aligned contact manner.

Furthermore, the second memory device 'BB' is formed on the second contact plug 160 of the first memory device 'AA'. The second memory device 'BB' may be a variable resistor element or a magnetic element. A spin torque transfer random access memory (STT-RAM), a magnetic RAM (MRAM), a polymer RAM (PoRAM) or a phase-change RAM (PCRAM) may be used as the second memory device 'BB'. The second memory device 'BB' may include a first electrode 165, a storage unit 170, and a second electrode 175 sequentially stacked. The first and second electrodes 165 and 175 are formed of a material that is different from the contact plugs 150 and 160, so that they may be formed of a material having a good electrical transfer characteristic. In particular, the first and second electrodes 165 and 175 may be formed of a metal layer having a good electrical transfer characteristic. In the exemplary embodiment, platinum (Pt) is used as the first and second electrodes 165 and 175. However, it is not limited thereto. Various metal layers or conductive layers, for example aluminum (Al), ruthenium (Ru), iridium (Ir), nickel (Ni), titanium nitride (TiN), titanium (Ti), cobalt (Ca), chrome (Cr), tungsten (W), cupper (Cu), zirconium (Zr), Hafnium (Hf) or a compound thereof may be used as the first and second electrodes 165 and 175 depending on the storage unit 170.

The storage unit 170 may be a material layer of which a resistance or a magnetic resistance ratio is varied by a voltage and current applied to the first and second electrodes 165 and 175. In a case where a variable resistor material is used for the storage unit 170, a perovskite-based material such as STO (SrTiO), PCMO(PrCaMnO), and GST(GeSbTe), or a transition metal oxide such as NiO, $TiO_2$, HfO, $Nb_2O_5$, ZnO, $ZrO_2$, $WO_3$, CoO, or $MnO_2$ may be used as the variable resistor material. Alternatively, in a case where a magnetic material is used for the storage unit 170, Fe, Co, Ni, NiFe, CoFe or CoFeB may be used as the magnetic material. In addition, the storage unit 170 may also be layered on the first electrode 165 so that the storage unit 170 may include a plurality of layers of respective materials and may have a thickness that can be freely changed by a designer.

In addition, the first electrode 165, the storage unit 170, and the second electrode 175 are patterned to obtain a desired line width of the variable resistor element or the magnetic element. The desired line width of the variable resistor element or the magnetic element may be obtained because the second memory device 'BB' is not restricted by the line width of the stack gate structure G of the first memory device 'AA'.

A bit line 185 is formed on the second memory device 'BB'. The bit line 185 is electrically connected to the second electrode 175.

An equivalent circuit of a unit memory cell of the semiconductor memory device having the above configuration is described as follows.

Figure 3:
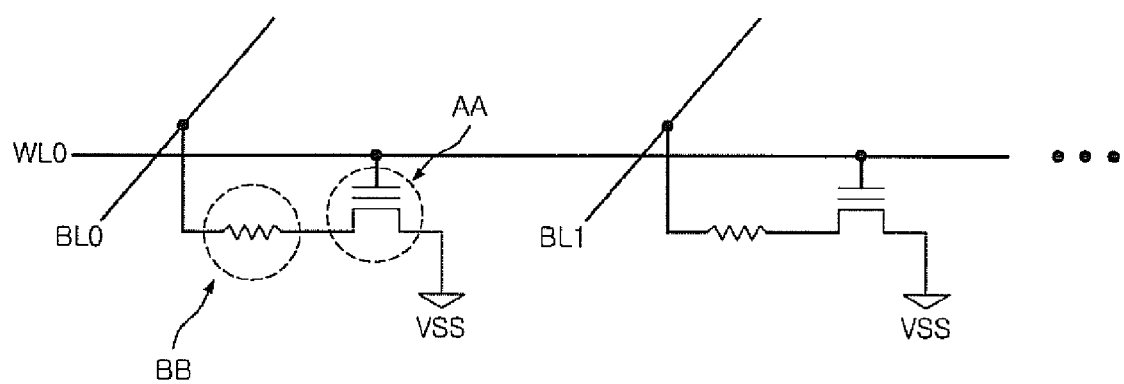
FIG. 3 is an equivalent circuit diagram of a unit memory cell of a semiconductor memory device according to an exemplary embodiment of the inventive concept.

As illustrated in FIG. 3, the semiconductor memory device of an exemplary embodiment may be configured of a first memory device 'AA' which is driven in response to a signal on a word line WL0 and a second memory device 'BB' which stores data based on a voltage difference (or a current difference) between an output voltage of the first memory device 'AA' and a bit line BL0.

The first memory device 'AA' which is a flash memory includes a control gate connected to the word line WL0, a source connected to a ground voltage and a drain connected to the second memory device 'BB'. The second memory device 'BB' which is a variable resistor element is connected between the bit line BL0 and the drain of the first memory device 'AA'. In addition, the word line WL0 and the bit lines BL0 and BL1 are arranged so that they are substantially crossed with each other.

Hereinafter, a driving of the unit memory cell will be described in more detail.

Write Driving of the First Memory Device

Figure 4A:
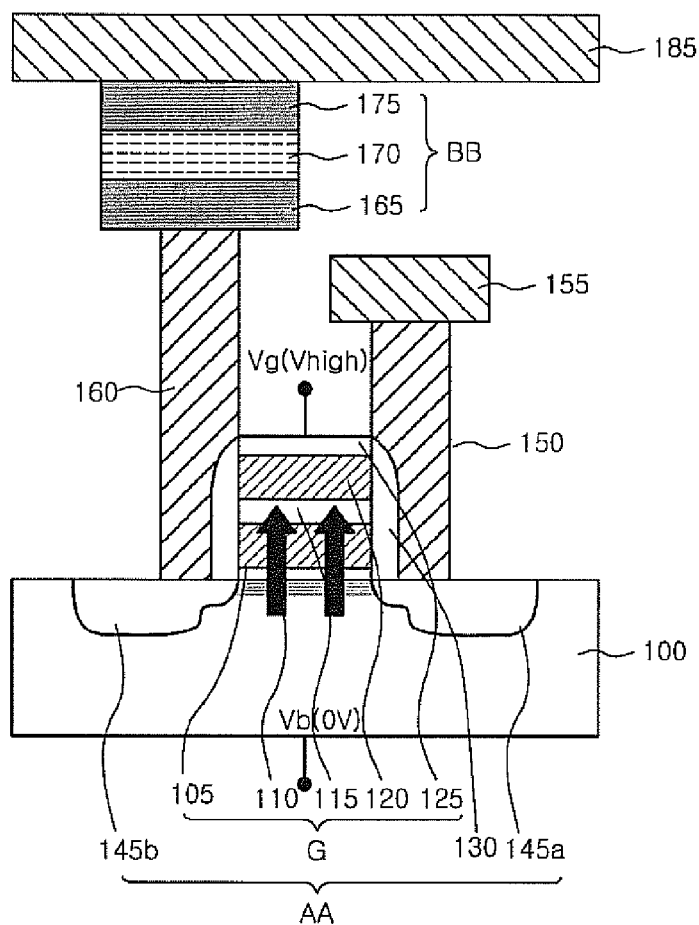
FIGS. 4A and 5A are cross-sectional views of a semiconductor memory device illustrating features of a write driving of a first memory device according to an exemplary embodiment of the inventive concept.
Figure 4B:
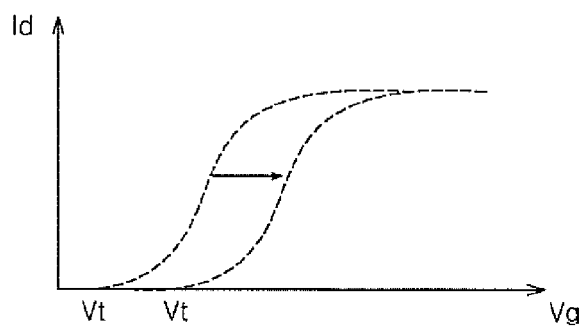
FIGS. 4B and 5B are graphs showing changes of threshold voltages in a write driving of a first memory device according to an exemplary embodiment of the inventive concept.

Referring to FIGS. 4A and 4B, to program charges in the charge storage layer (or the charge trap layer) 110 which is a storage unit (hereinafter, referred to as a first storage unit) of the first memory device 'AA', a high voltage Vhigh is applied to the control gate 120 as a gate voltage Vg and a back bias voltage Vb of 0V is applied to the semiconductor substrate 100, under the condition that a channel has been formed between the source 145a and the drain 145b of the first memory device 'AA'.

Then, charges of the channel formed between the source 145a and the drain 145b tunnel toward the charge storage layer (or the charge trap layer) 110. Due to the tunneling, a threshold voltage Vt of a channel region in the first memory device 'AA' is increased so that a channel resistance becomes high. Herein, in FIG. 4B, the X-axis denotes the control gate voltage Vg and the Y-axis denotes a drain current Id. FIG. 4B, illustrates the increase in the threshold voltage Vt.

Figure 5A:
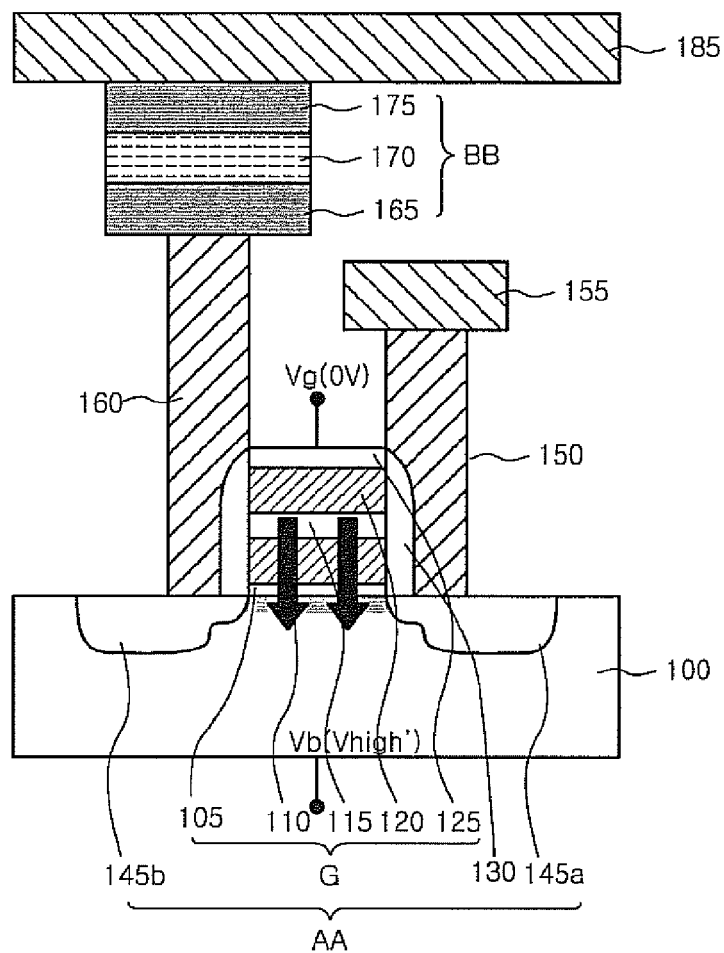
Figure 5B:
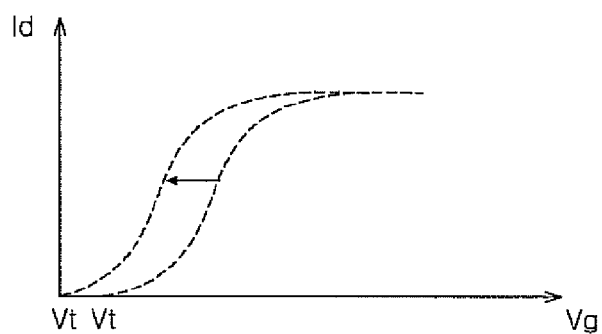

On the other hand, as illustrated in FIGS. 5A and 5B, if a high voltage Vhigh' is applied to the semiconductor substrate 100 as the back bias voltage Vb and a voltage of 0V is applied to the control gate 120, charges stored in the charge storage layer (or the charge trap layer) 110 tunnel toward the channel. Due to this tunneling, the threshold voltage Vt of the first memory device 'AA' decreases so that a channel resistance becomes low.

Accordingly, it is possible to perform a writing of 2 bits or more through the use of the first memory device 'AA' alone.

Write Driving of the Second Memory Device

When writing data in the storage unit 170 (also referred to as the second storage unit) of the second memory device 'BB', the data is written based on a voltage difference (or a current amount) between a drain voltage, transferred from the source interconnection 155, and a voltage of the bit line 185 under the condition that a channel has been formed between the source 145a and the drain 145b as illustrated in FIG. 6.

More specifically, a voltage, which is greater than the threshold voltage Vt, is applied to the control gate 120 to form the channel between the source 145a and the drain 145b. Afterward, a source voltage (ground voltage) Vs and a data voltage Vd are applied to the source interconnection 155 and the bit line 185, respectively. Then, a voltage (or a current) applied through the source interconnection 155 is transferred to the second storage unit 170 through the channel and the drain 145b of the first memory device 'AA'. The second storage unit 170, which is the variable resistor element or the magnetic element, has a high or low resistance according to a voltage difference (or a current amount) between the first and second electrodes 165 and 175. Herein, the voltage difference (or the current amount) for the high or low resistance may be varied by a material property of the second storage unit 170.

Read Driving of the First and Second Memory Devices

The semiconductor memory device according to an exemplary embodiment reads out a data state according to a summation of the resistances of the first and second storage units 110 and 170.

Figure 7:
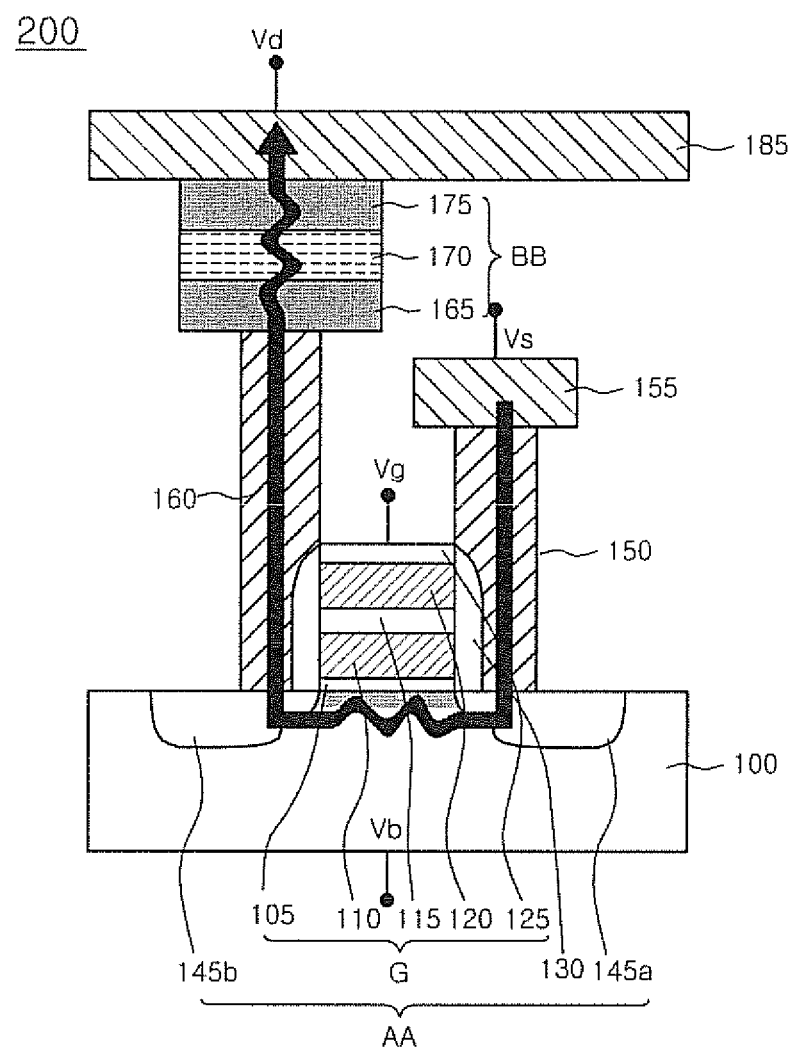
FIG. 7 is a cross-sectional view of a semiconductor memory device illustrating features of a read driving of first and second memory devices according to an exemplary embodiment of the inventive concept.

First, as illustrated in FIG. 7, a gate voltage Vg, which is more than the threshold voltage Vt and less than a saturation voltage Vsat (i.e., Vt<Vg<Vsat), is applied at the control gate 120 to form a channel between the source 145a and the drain 145b of the flash memory.

Then, appropriate voltages are applied to the source interconnection 155 and the bit line 185, respectively to change the resistances of the first and second storage units 110 and 170, thereby reading out various data.

The following table (Table I) indicates current amounts of the semiconductor memory device according to the resistances of the first and second storage units 110 and 170 and shows that data may be classified on the basis of the current amount.

TABLE I

| Resistance of first storage unit | Resistance of second storage unit | Order in total current amount of hybrid device |
|---|---|---|
| low | low | 1 |
| high | low | 2 |
| low | high | 3 |
| high | high | 4 |

Referring to Table I, the resistance of the first storage unit 110 indicates a channel resistance of the flash memory, which depends on charges of the charge storage layer (or the charge trap layer) 110. Meanwhile, the resistance of the second storage unit 170 indicates a resistance of the variable resistor material layer or the magnetic element layer 170.

Herein, the order may change so that the conditions that produce the second current amount and the third current amount in Table I may be swapped. The current amount order may be different in other embodiments depending on the driving abilities of the first and second memory devices 'AA' and 'BB'. That is, if the driving ability of the first memory device 'AA' is large, the total current amount may be more affected by the resistance of the first memory device 'AA'.

Figure 8:
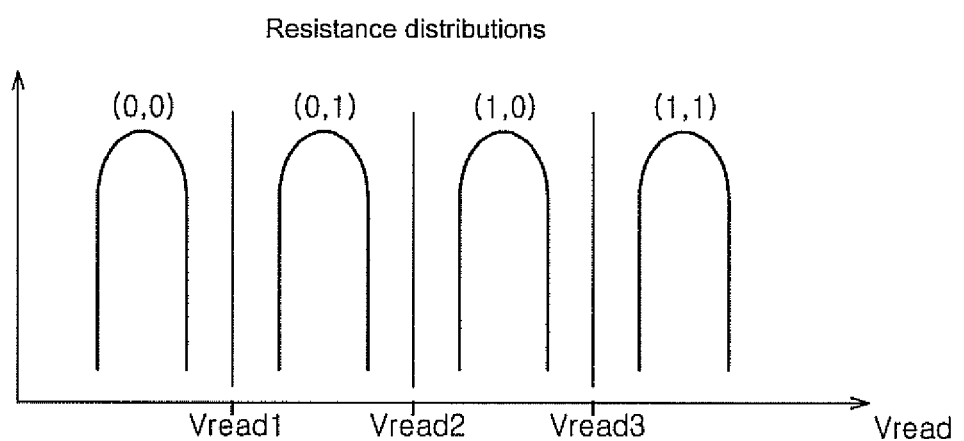
FIG. 8 is a graph showing resistance distribution according to a read voltage of a semiconductor memory device according to an exemplary embodiment of the inventive concept.

According to Table I, the first memory device 'AA' and the second memory device 'BB' enable at least 2 bit driving, respectively. Thus, there may be a total of four binary combinations (00), (01), (10) and (11) resulting from four resistance distributions, which may be distinguished using a reading voltage Vread, as illustrated in FIG. 8. Therefore, the semiconductor memory device of the inventive concept can realize at least 8 bits by a combination of the first and second memory devices. Herein, Vread1, Vread2, and Vread 3 may be different read voltages for distinguishing between the four resistance distributions.

In an exemplary embodiment, when the data is read out, the semiconductor memory device is configured to have the channel resistance of the flash memory, that is, the resistance of the first storage unit, so that it is not necessary to dispose an additional switch. Here, the channel itself serves as the switch.

Accordingly, multi-bits can be realized by the combination of the two memory devices, and the overall device fabrication process can be simplified because the switch fabrication process can be excluded.

According to the inventive concept as described above, the variable resistor element or the magnetic element is formed between the drain of the flash memory and the bit line of the multi-functional semiconductor memory device.

Accordingly, the variable resistor element or magnetic element can be fabricated independently of the flash memory so that there are no limitations with respect to a material, a size, and a shape of the variable resistor element or the magnetic element.

In addition, multi-bit data can be stored according to the channel resistance of the flash memory by the combination of the two memory devices so that multi-bits can be realized without fabrication of an additional switch device.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A semiconductor memory device, comprising:
   a first memory device formed on a semiconductor substrate, including a source, a drain and a first storage unit;
   a second memory device, including a second storage unit; and
   a bit line,
   wherein the second memory device is connected in series between the drain of the first memory device and the bit line, and
   the first memory device and the second memory device are configured to share the bit line.

2. The semiconductor memory device of claim 1, wherein the first memory device includes a flash memory.

3. The semiconductor memory device of claim 2, wherein the flash memory device includes:
   a tunneling insulating layer formed on the semiconductor substrate between the source and the drain;
   the first storage unit formed on the tunneling insulating layer;
   a blocking layer formed on the first storage unit; and
   a control gate formed on the blocking layer.

4. The semiconductor memory device of claim 3, wherein the first storage unit includes at least one of a polysilicon layer, a silicon nitride layer, a silicon dot, and a metal dot.

5. The semiconductor memory device of claim 3, further comprising:
   a word line electrically connected to the control gate; and
   a source interconnection electrically connected to the source.

6. The semiconductor memory device of claim 5, further comprising:
   a first contact plug formed between the source and the source interconnection; and
   a second contact plug formed between the drain and the second memory device.

7. The semiconductor memory device of claim 6, wherein the second contact plug has a height different from the first contact plug.

8. The semiconductor memory device of claim 3, wherein the first storage unit is a charge storage layer or a charge trap layer.

9. The semiconductor memory device of claim 1, wherein the second memory device is a variable resistor element or a magnetic element.

10. The semiconductor memory device of claim 9, wherein the second memory device includes:
    a first electrode electrically connected to the drain;
    the second storage unit formed on the first electrode; and
    a second electrode formed on the second storage unit and electrically connected to the bit line.

11. The semiconductor memory device of claim 10, wherein in the case where the second memory device is the variable resistor element, the second storage unit of the variable resistor element includes a material of which a resistance is varied by a voltage difference or a current amount between the first and second electrodes.

12. The semiconductor memory device of claim 10, wherein in the case where the second memory device is the magnetic element, the second storage unit of the magnetic element includes a material of which a magnetic resistance ratio is varied by a voltage difference or a current amount between the first and second electrodes.

13. The semiconductor memory device of claim 10, wherein the second memory device has a line width independent of that of the first memory device.

14. The semiconductor memory device of claim 1, further comprising:
    a word line; and
    the first memory device is configured to store data in the first storage unit in response to a signal of the word line; and
    the second memory device is configured to store data in the second storage unit when the first memory device is selected.

15. The semiconductor memory device of claim 14, wherein the bit line is disposed to be crossed with the word line.

16. The semiconductor memory device of claim 14, wherein the semiconductor memory device is configured to store data in the first storage unit by providing a write voltage to the first memory device, and store data in the second storage unit by a voltage difference between an output voltage of the first memory device and a data voltage.

17. The semiconductor memory device of claim 16, wherein the first memory device is a flash memory and is configured to store the data in the first storage unit according to a difference between voltages applied to a control gate of the flash memory and a body of the flash memory.

18. The semiconductor memory device of claim 17, wherein the second memory device is a variable resistor element or a magnetic element and is configured to store the data in the second storage unit according to a difference between a voltage of the drain of the flash memory and the data voltage provided from the bit line.

19. The semiconductor memory device of claim 18, wherein the data is stored in the second memory device under the condition that a channel has been formed in the first memory device.

20. The semiconductor memory device of claim 19, wherein the data stored in the first storage unit and the data stored in the second storage unit are read out simultaneously.

21. The semiconductor memory device of claim 20, wherein logic levels of the data are determined according to a current value controlled by the summation of resistances of the first and second storage units under the condition that the first memory device has been driven.

* * * * *